(12) United States Patent
Sasuga et al.

(10) Patent No.: US 7,061,454 B2
(45) Date of Patent: Jun. 13, 2006

(54) LIGHT EMITTING DIODE DEVICE

(75) Inventors: Masatoshi Sasuga, Yamanashi-ken (JP); Yoshihisa Hirayama, Yamanashi-ken (JP); Ryo Tamura, Yamanashi-ken (JP); Takashi Akiyama, Tokyo (JP)

(73) Assignee: Citizen Electronics Co., Ltd., Yamanashi-ken (JP)

( * ) Notice: Subject to any disclaimer, the term of this patent is extended or adjusted under 35 U.S.C. 154(b) by 397 days.

(21) Appl. No.: 10/619,507

(22) Filed: Jul. 16, 2003

(65) Prior Publication Data
US 2004/0021629 A1    Feb. 5, 2004

(30) Foreign Application Priority Data
Jul. 18, 2002    (JP) ............................. 2002-210305

(51) Int. Cl.
*G09G 3/32*    (2006.01)
*G09G 3/14*    (2006.01)

(52) U.S. Cl. .......................................... 345/82; 345/39
(58) Field of Classification Search ................ 345/82, 345/39, 40, 42, 46, 83
See application file for complete search history.

(56) References Cited

U.S. PATENT DOCUMENTS

2002/0034071 A1*  3/2002  Mabuchi ...................... 362/31
2002/0070681 A1*  6/2002  Shimizu et al. ............. 315/246
2002/0171911 A1* 11/2002  Maegawa ................... 359/308

\* cited by examiner

*Primary Examiner*—Regina Liang
*Assistant Examiner*—Stephen Sherman
(74) *Attorney, Agent, or Firm*—Dennison, Schultz, Dougherty & MacDonald

(57) ABSTRACT

An LED device comprises a white LED device and a red LED device. The white LED device has a substrate, a blue LED mounted on the substrate for emitting blue light, a transparent resin covering the blue LED and including phosphor particles. The phosphor particle has a quality to convert blue light to white light, if the particle contacts with the blue light. The red LED device has a substrate, a red LED mounted on the substrate for emitting red light, and a transparent resin covering the red LED device is disposed so that emitted red light mixes with the white light emitted from the white LED device.

4 Claims, 6 Drawing Sheets

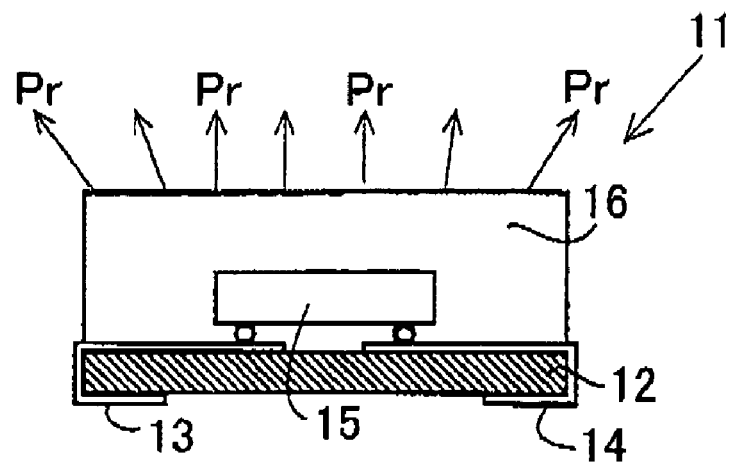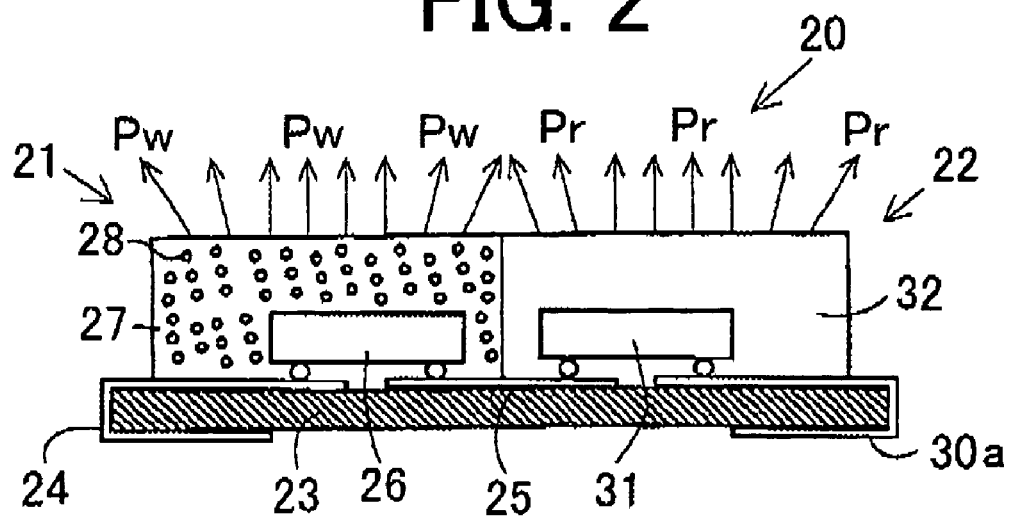

LIGHT EMITTING DIODE DEVICE

BACKGROUND OF THE INVENTION

The present invention relates to a light emitting diode device using a light emitting diode (LED), for illuminating a display such as a liquid crystal display.

FIG. 8 is a sectional view showing a conventional LED device of a fluorescence color mixing type for emitting white color light.

The LED device 10 comprises a substrate 1 having a pair of terminal electrodes 2, 3 provided on the upper surface and the underside thereof, and a blue LED 4 emitting blue light. The LED 4 and the upper surface of the substrate 1 are covered by a transparent resin 5. In the resin 5, phosphor particles 6 of YAG are mixed. The LED device 10 emits white light Pw by color mixing as described hereinafter.

Referring to FIG. 9 which is an enlarged view of a part of FIG. 8, when a driving voltage is applied to the terminal electrodes 2 and 3, the LED 4 is excited to emit blue light Pb. When the blue light Pb meets the particle 6, the blue light Pb changes into yellow light Py based on the wavelength conversion. The yellow light Py is mixed with the blue light Pb which has not met the particle 6, so that the mixture of the yellow light and blue light takes on white. Thus, the LED device produces the white light Pw.

FIG. 10 is a wavelength characteristic graph of the LED device 10. A luminous intensity curve H1 has a peak Kb at wavelength 450 µm of the blue light component, and has a peak Ky at wavelength 550 µm of yellow light component. However, there is no peak at wavelength 650 µm of the red light component. Since the red light component is hardly included, the emitted white light tones cold blue light.

FIG. 11 is a wavelength characteristic graph of the LED device and an RGB color filter which is used in a color display. When blue or green is selected by the filter, display of each color is obtained. However, when red is selected, red light is scarcely included in a passing range of the red light filter. Consequently, a red selected part tones red yellow color.

Therefore, if the LED device is used for illuminating the display, a red selecting part is displayed with red yellow color.

SUMMARY OF THE INVENTION

An object of the present invention is to provide an LED device which may emit white light including red light in spite of using a blue LED in the device.

According to the present invention, there is provided an LED device comprising a white LED device having a substrate a blue LED mounted on the substrate for emitting blue light, a transparent resin covering the blue LM and including phosphor particles each of which has a quality to convert blue light to white light, if the particle contacts with the blue light, a red LED device having a substrate, a red LED mounted on the substrate for emitting red light, and a transparent resin covering the red LED, and the red LED device being disposed so that emitted red light mixes with the white light emitted from the white LED device.

The white LED device and the red LED device are mounted on a same substrate.

The blue LED and the red LED may be covered by a single transparent resin including phosphor particles.

These and other objects and features of the present invention will become more apparent from the following detailed description with reference to the accompanying drawings.

BRIEF DESCRIPTION OF DRAWINGS

FIG. 1 is a sectional view showing a red LED device used in an LED device of the present invention;

FIG. 2 is a sectional view of the LED device of the present invention;

DETAILED DESCRIPTION OF THE PREFERRED EMBODIMENT

Figure 3:
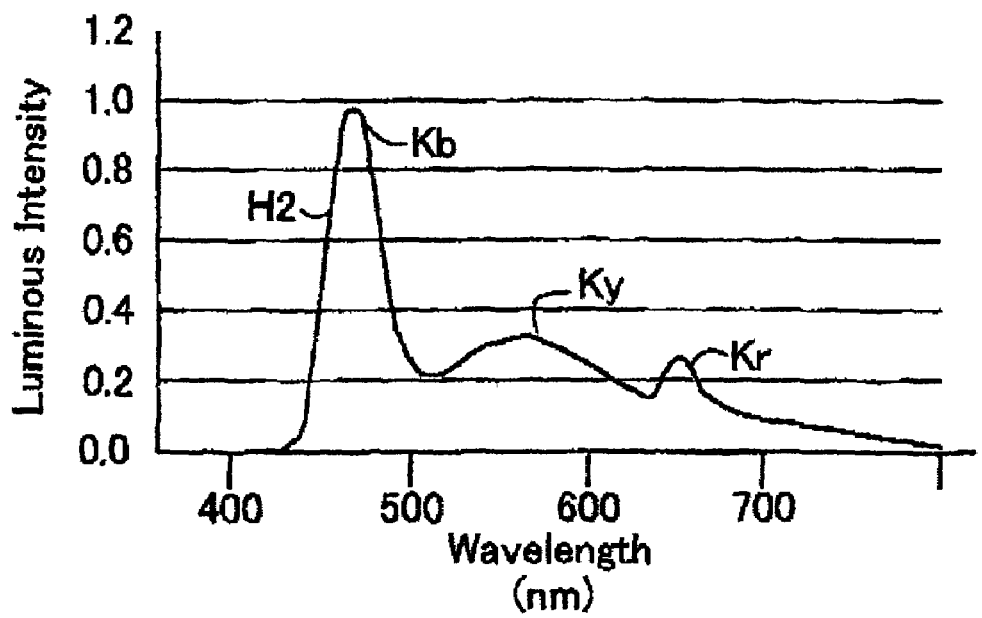
FIG. 3 is a wavelength characteristic graph of the LED device.

FIG. 1 is a sectional view showing a red LED device used in an LED device of the present invention.

The LED device 11 comprises a substrate 12 having a pair of terminal electrodes 13, 14 provided on the upper surface and the underside thereof, and a red LED 15 emitting red light. The LED 15 and the upper surface of the substrate 12 are covered by a transparent resin 16.

When a driving voltage is applied to the terminal electrodes 13 and 14, the LED 15 is excited to emit red light Pr.

Referring to FIG. 2 showing a sectional view of an LED device 20 according to a first embodiment of the present invention, the LED device 20 comprises a white LED device 21 emitting bluish white light and a red LED device 22 emitting red light, both the devices being provided on a common substrate 23.

The white LED device 21 comprises the substrate 23 having a pair of terminal electrodes 24, 25 provided on the upper surface and the underside thereof, and a blue LED 26 emitting blue light. The LED 26 and the upper surface of the substrate 23 are covered by a transparent resin 27. In the resin 27, phosphor particles 28 of YAG or green phosphor, or one of phosphate, silicate or aluminate are mixed. Thus, The LED device 21 emits white light Pw by color mixing as described above.

The red LED device 22 comprises the substrate 23 having a pair of terminal electrodes 25, 30a provided on the upper surface and the underside thereof, and a red LED 31 emitting red light. The LED 31 and the upper surface of the substrate 23 are covered by a transparent resin 32. Therefore, the red LED device produces red light Pr. Meanwhile the common substrate 23 and the resin 32 are composed as a case for mounting the LED device 20 in an electronic instrument.

The white light Pw and the red light Pr are mixed, so that the mixed light takes on white light including red light having a hot feeling.

FIG. 3 is a wavelength characteristic graph of the LED device 20. A luminous intensity curve H2 has a peak Kb at wavelength 450 μm of the blue light component, and has a peak Ky at wavelength 550 μm of yellow light component. Furthermore, there is a peak Kr at wavelength 650 μm of the red light component. Since the red light component is included, the emitted white light has a hot feeling.

Figure 4:
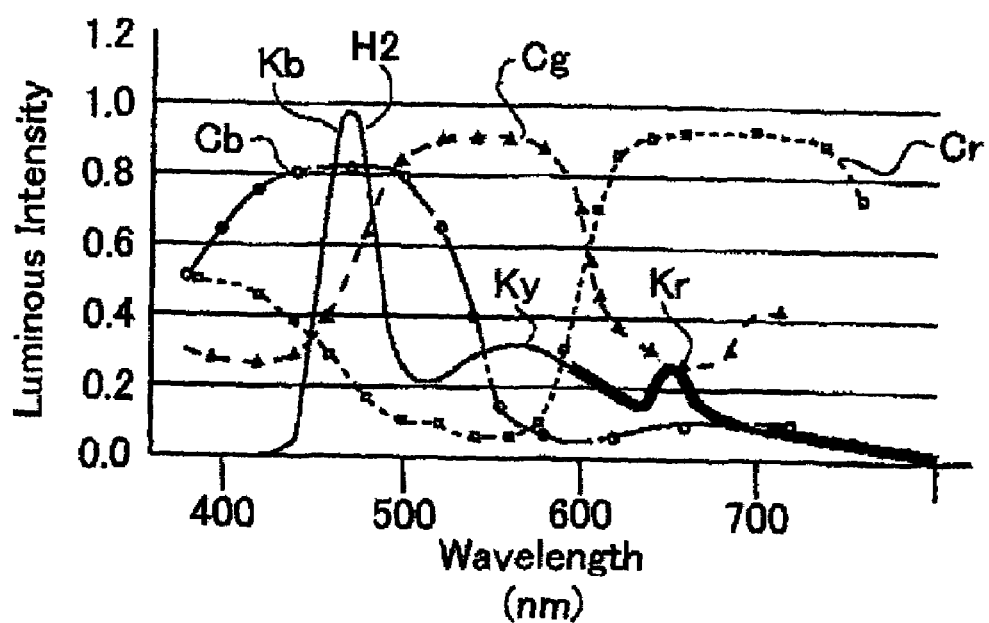
FIG. 4 is a graph of luminous intensity of the LED device.

FIG. 4 is a graph of luminous intensity of the LED device 20 and luminous intensity of an RGB color filter which is used in a general color display. When blue or green is selected by the filter, display of each color Kb or Kg is obtained. Furthermore, when red is selected, red light Kr is obtained. Consequently, it is possible to illuminate a display with natural color light.

Figure 5:
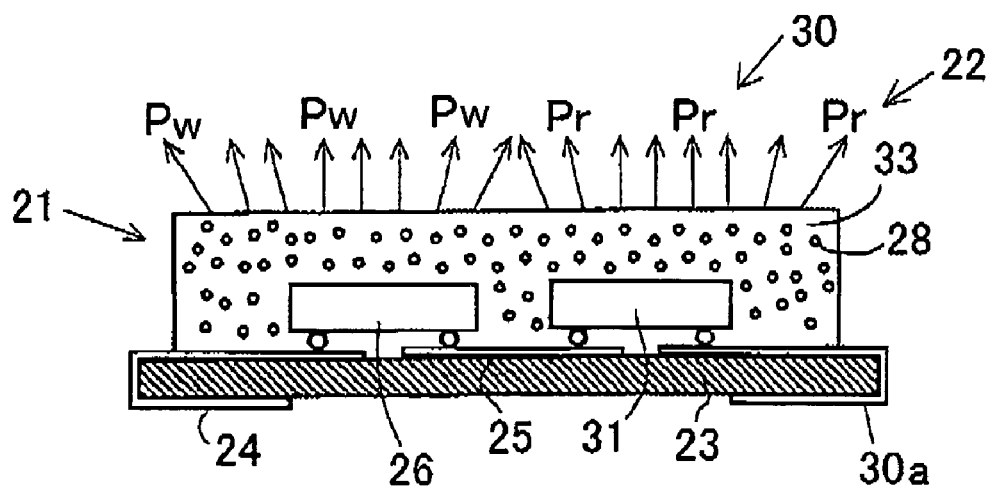
FIG. 5 is a sectional view showing an LED device according to a second embodiment of the present invention.

FIG. 5 in a sectional view showing an LED device 30 according to a second embodiment of the present invention. The LED device 30 has a common resin 33 including phosphor particles 28 of YAG and covering the con substrate 23, blue LED 26 and red LED 31. Other parts are the same as the first embodiment and identified with the same reference numerals.

In the device, the red light Pr strikes particles 28. However, the wavelength of the red light is not converted by the collision. Therefore, the red light is mixed with the white light emitted from the white LED device 21, thereby producing the same white light as that of the first embodiment.

Figure 6:
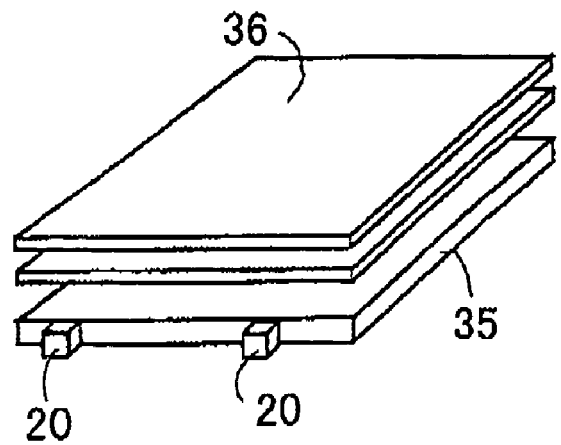
FIGS. 6 and 7 are perspective views, each showing an illuminating device using the LED device of the present invention.
Figure 7:
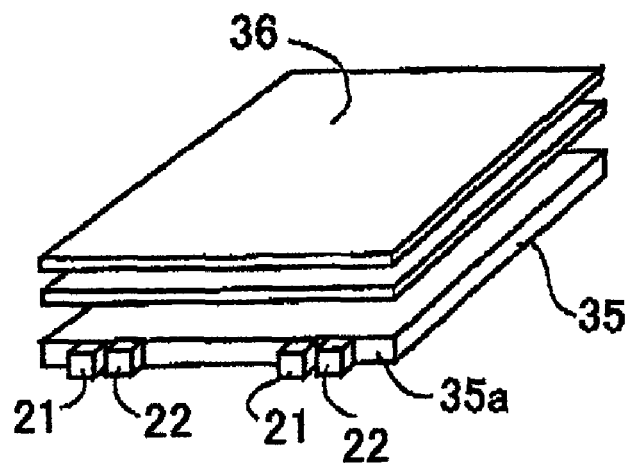
Figure 8:
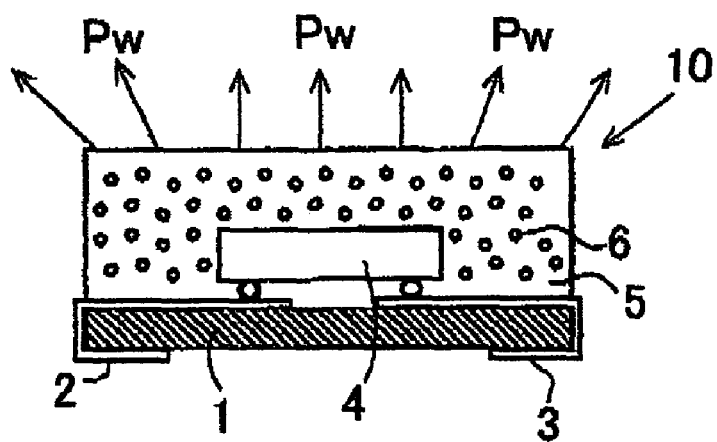
FIG. 8 is a sectional view showing a conventional LED device of a fluorescence color mixing type for emitting white color.
Figure 9:
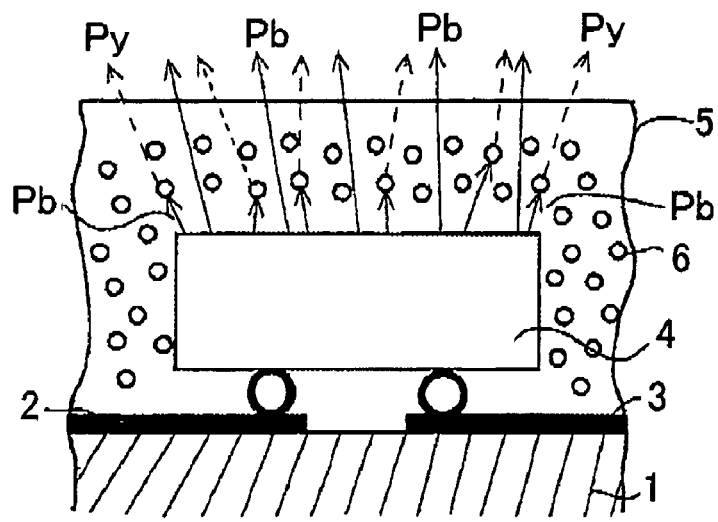
FIG. 9 is an enlarged view of FIG. 8.
Figure 10:
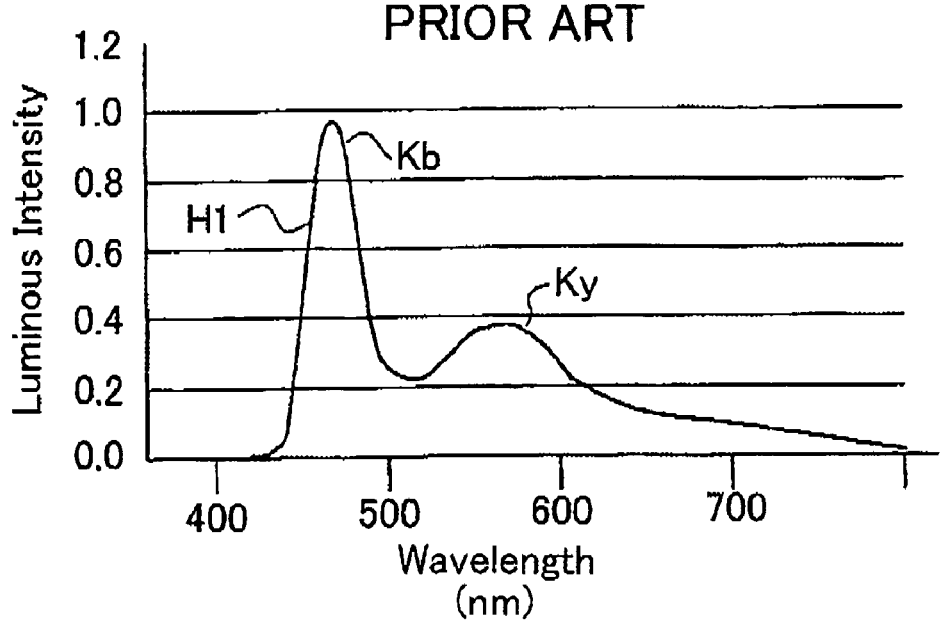
FIG. 10 is a wavelength characteristic graph of the LED device.
Figure 11:
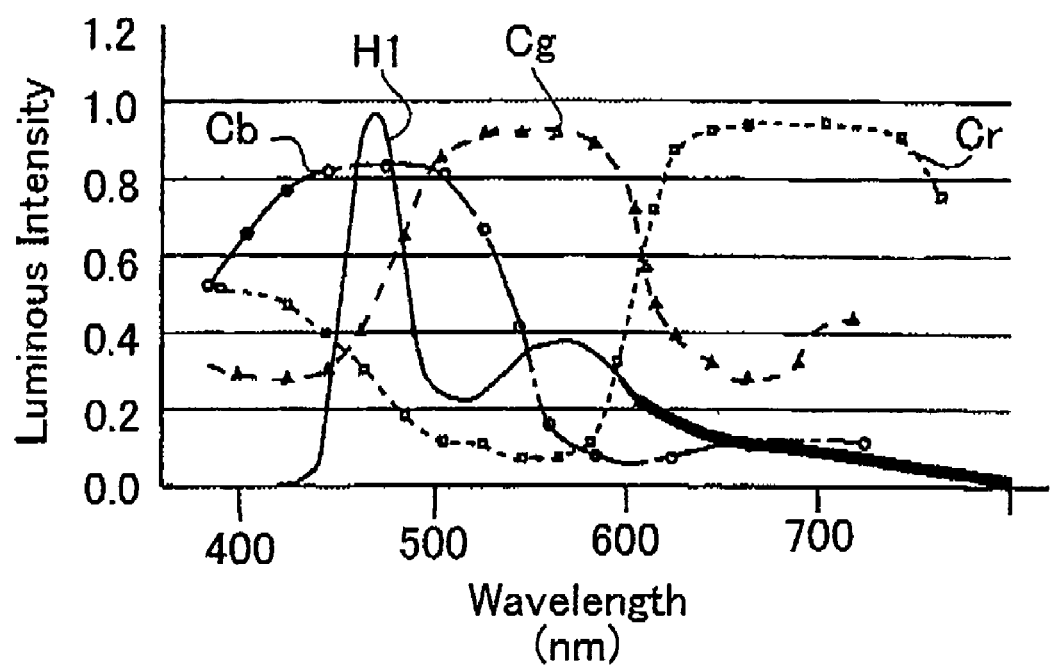
FIG. 11 is a wavelength characteristic graph of the LED device.

FIGS. 6 and 7 are perspective views, each showing an illuminating device using the LED device of the present invention. In the device of FIG. 6, a lighting panel 35 is disposed below a display 36 such as a liquid crystal display. Corresponding to a front side of the lighting panel 35, a pair of the LED device 20 or 30 are provided as edge light.

White light emitted from the LED device enters in the lighting panel 35, and is reflected by a reflecting means provided in the lighting panel. The reflected light illuminates the display 36.

In the device of FIG. 7, two sets of LED devices, each comprising the white LED device 21 and the red LED device 22, are provided as edge light. Lights emitted from both devices 21 or 22 are fixed in the lighting panel to be converted into desired white color.

In accordance with the present invention, the LED device emits light having a natural color feeling as described above.

Thus, the present invention provides an LED device which my produce illuminating light having light color rendering properties.

While the invention has been described in conjunction with preferred specific embodiment thereof, it will be understood that this description is intended to illustrate and not limit the scope of the invention, which is defined by the following claims.

What is claimed is:

1. An LED device comprising:
a substrate;
a blue LED mounted on the substrate for emitting blue light;
a first transparent resin covering the blue LED;
phosphor particles, each of which has a wave length converting characteristic to convert blue light emitted by the blue LED to yellow light, disposed in the first transparent resin;
a red LED mounted on the substate for emitting red light; and
a second transparent resin covering the red LED;
wherein:
the first transparent resin is constructed and arranged to discharge white light formed by mixing the blue light of the LED with yellow light produced when the blue light strikes the phosphor particles;
the second transparent resin is constructed and arranged to discharge red light; and
the first and second transparent resins are constructed and arranged such that the discharge white light and the red light are mixed in an atmosphere surrounding the first and second resins.

2. The LED device according to claim 1 wherein the phosphor particles are particles of YAG.

3. The LED device according to claim 1 wherein the phosphor particle is green phosphor.

4. The LED device according to claim 1 wherein the phosphor particle is one of phosphate, silicate and aluminate.

* * * * *